(12) United States Patent
Ong et al.

(10) Patent No.: US 6,861,664 B2
(45) Date of Patent: Mar. 1, 2005

(54) DEVICE WITH N-TYPE SEMICONDUCTOR

(75) Inventors: Beng S. Ong, Mississauga (CA);
Dasarao K. Murti, Mississauga (CA);
James M. Duff, Mississauga (CA);
Yiliang Wu, Mississauga (CA)

(73) Assignee: Xerox Corporation, Stamford, CT (US)

( * ) Notice: Subject to any disclaimer, the term of this patent is extended or adjusted under 35 U.S.C. 154(b) by 6 days.

(21) Appl. No.: 10/627,860

(22) Filed: Jul. 25, 2003

(65) Prior Publication Data

US 2005/0017237 A1 Jan. 27, 2005

(51) Int. Cl.⁷ ............................................. H01L 51/00

(52) U.S. Cl. ......................... 257/40; 257/40; 257/759

(58) Field of Search ........................... 257/40, 39, 642, 257/643, 759, 20, 22, 24

(56) References Cited

U.S. PATENT DOCUMENTS

| | | | | |
|---|---|---|---|---|
| 4,587,189 A | | 5/1986 | Hor et al. ....................... 430/59 |
| 5,174,921 A | * | 12/1992 | Buchecker et al. ..... 252/299.63 |
| 5,225,307 A | | 7/1993 | Hor et al. .................... 430/136 |
| 6,387,727 B1 | | 5/2002 | Katz et al. ..................... 438/99 |
| 2002/0164835 A1 | | 11/2002 | Dimitrakopoulos et al. .. 439/99 |

OTHER PUBLICATIONS

Amit Babel et al., "Electron Transport in Thin–Film Transistors from an n–Type Conjugated Polymer," *Adv. Mater.* 14, No. 5, pp. 371–374 (Mar. 4, 2002).

H.E. Katz et al., "A soluble and air–stable organic semiconductor with high electron mobility," *Nature*, vol. 404, pp. 478–480 (Mar. 30, 2000).

Patrick R. L. Malenfant et al., "N–type organic thin–film transistor with high field–effect mobility based on a N,N'–dialkyl–3,4,9,10–perylene tetracarboxylic diimide derivative," *Applied Physics Letters*, vol. 80, No. 14, pp. 2517–2519 (Apr. 8, 2002).

(List continued on next page.)

*Primary Examiner*—David Nelms
*Assistant Examiner*—Thinh T Nguyen
(74) *Attorney, Agent, or Firm*—Zosan S. Soong

(57) ABSTRACT

An electronic device includes a semiconductor layer in contact with a number of electrodes, wherein the semiconductive layer includes a compound wherein either or both of the following geometric isomers of the compound are present:

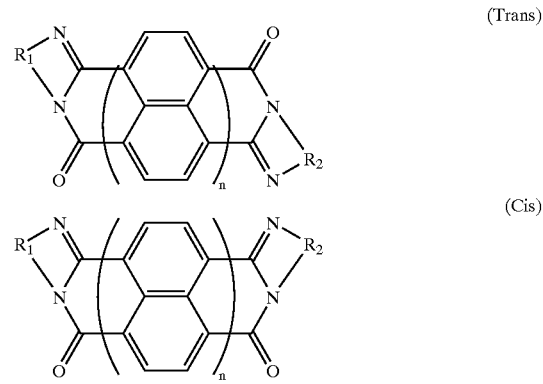

wherein:
n is 1, 2 or 3 for the polycyclic moiety; and
$R_1$ and $R_2$ are independently selected from the group consisting of a hydrocarbon ring and a heterocyclic group, wherein $R_1$ and $R_2$ are the same or different hydrocarbon ring, the same or different heterocyclic group, or one of $R_1$ and $R_2$ is the hydrocarbon ring and the other the heterocyclic group.

22 Claims, 2 Drawing Sheets

OTHER PUBLICATIONS

Howard E. Katz et al., "Naphthalenetetracarboxylic Diimide–Based n–Channel Transistor Semiconductors: Structural Variation and Thiol–Enhanced Gold Contacts," *J. Am. Chem. Soc.*, vol. 122, pp. 7787–7792 (2000).

J. H. Schon et al., "Perylene: A promising organic field–effect transistor material," *Applied Physics Letters*, vol. 77, No. 23, pp. 3776–3778 (Dec. 4, 2000).

* cited by examiner

DEVICE WITH N-TYPE SEMICONDUCTOR

BACKGROUND OF THE INVENTION

Thin film transistor (referred herein as "TFT") is the key component of integrated circuits for electronic devices. Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low-end microelectronics such as smart cards and RFID tags. TFTs fabricated from organic or polymer materials are potentially very low cost, and may also be functionally and structurally more desirable than conventional silicon technology in the aforementioned areas in that they may offer mechanical durability, structural flexibility, compact and light weight characteristics, and the potential of being able to be incorporated directly onto the active media of the devices, thus lowering manufacturing cost and enhancing device compactness for transportability.

Currently, the most developed organic TFTs are based on pentacene and oligo or polythiophenes. The performance of these materials, in terms of mobility and current on/off ratio, now match the requirements for numerous applications such as active matrix addressing arrays for displays or basic switching and memory devices. However, most of the compounds with the desirable properties are p-type, meaning that negative gate voltages, relative to the source voltage, are applied to induce positive charges (hole) in the channel region of the devices. However, both p-type and n-type semiconductor materials are required to form a complementary circuit. Advantages of complementary circuits, compared to ordinary TFT circuits, include higher energy efficiency, longer lifetime, and better tolerance of noise.

Only a limited number of materials have been developed for the n-type component of such organic complementary circuits, because of the lack of suitable n-type organic materials and theoretical arguments which predict a reduced stability of the n-conducting radical anions under ambient conditions. There is a need, which the present invention addresses, for inventions that expand the choice of n-type semiconductor materials suitable for electronic devices.

The following documents may be relevant:

Amit Babel et al., "Electron Transport in Thin-Film Transistors from an n-Type Conjugated Polymer," *Adv. Mater.* 14, No. 5, pp. 371–374 (Mar. 4, 2002), which discloses a field effect transistor made from a ladder poly (benzobisimidazobenzophenanthroline) ("BBL") thin film where the structural formula of BBL is depicted in FIG. 1.

H. E. Katz et al., "A soluble and air-stable organic semiconductor with high electron mobility," *Nature*, Vol. 404, pp. 478–480 (Mar. 30, 2000).

Patrick R. L. Malenfant et al., "N-type organic thin-film, transistor with high field-effect mobility based on a N,N'-dialkyl-3,4,9,10-perylene tetracarboxylic diimide derivative," *Applied Physics Letters*, Vol. 80, No. 14, pp. 2517–2519 (Apr. 8, 2002).

Howard E. Katz et al., "Naphthalenetetracarboxylic Diimide-Based n-Channel Transistor Semiconductors: Structural Variation and Thiol-Enhanced Gold Contacts," *J. Am. Chem. Soc.*, Vol. 122, pp. 7787–7792 (2000).

J. H. Schon et al., "Perylene: A promising organic field-effect transistor material," *Applied Physics Letters*, Vol. 77, No. 23, pp. 3776–3778 (Dec. 4, 2000).

Katz et al., U.S. Pat. No. 6,387,727 B1.

Dimitrakopoulos et al., U.S. patent application Publication No. 2002/0164835 A1.

Hor et al., U.S. Pat. No. 4,587,189.

Hor et al., U.S. Pat. No. 5,225,307.

BRIEF SUMMARY

The present invention is accomplished in embodiments by providing an electronic device comprising a semiconductor layer in contact with a number of electrodes, wherein the semiconductive layer includes a compound wherein either or both of the following geometric isomers of the compound are present:

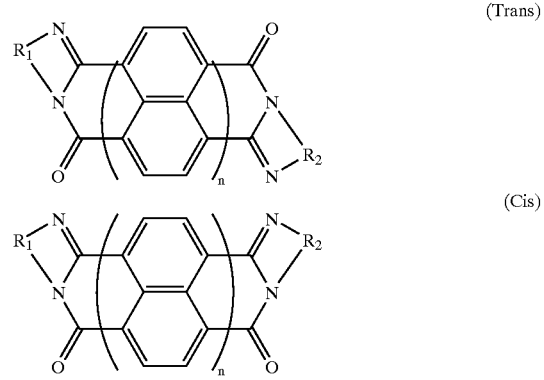

wherein:

n is 1, 2 or 3 for the polycyclic moiety; and $R_1$ and $R_2$ are independently selected from the group consisting of a hydrocarbon ring and a heterocyclic group, wherein $R_1$ and $R_2$ are the same or different hydrocarbon ring, the same or different heterocyclic group, or one of $R_1$ and $R_2$ is the hydrocarbon ring and the other the heterocyclic group.

There is further provided in embodiments, a thin film transistor device comprising:

an insulating layer;

a gate electrode;

a semiconductor layer;

a source electrode; and a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, wherein the semiconductor layer includes a compound wherein either or both of the following geometric isomers of the compound are present:

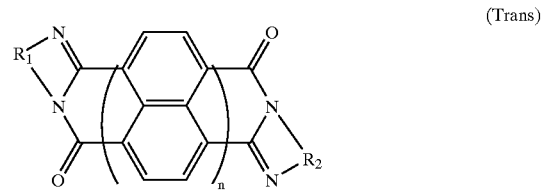

-continued

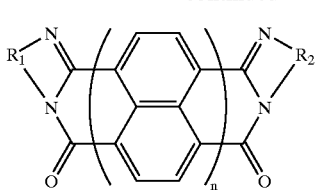

(Cis)

wherein:

n is 1, 2 or 3 for the polycyclic moiety; and $R_1$ and $R_2$ are independently selected from the group consisting of a hydrocarbon ring and a heterocyclic group, wherein $R_1$ and $R_2$ are the same or different hydrocarbon ring, the same or different heterocyclic group, or one of $R_1$ and $R_2$ is the hydrocarbon ring and the other the heterocyclic group.

BRIEF DESCRIPTION OF THE DRAWINGS

Other aspects of the present invention will become apparent as the following description proceeds and upon reference to the Figures which represent illustrative embodiments.

Unless otherwise noted, the same reference numeral in different Figures refers to the same or similar feature.

DETAILED DESCRIPTION

Figure 1:
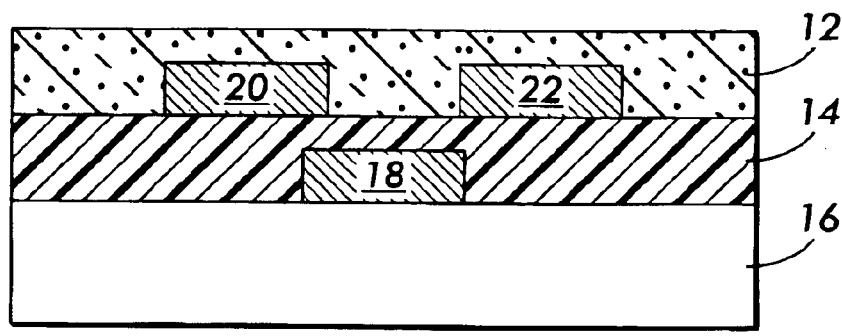
FIG. 1 represents a first embodiment of the present invention in the form of a thin film transistor.

A semiconductor layer of the present electronic device contains a compound ("Compound"), wherein either or both of the following geometric isomers of the Compound are present:

wherein:

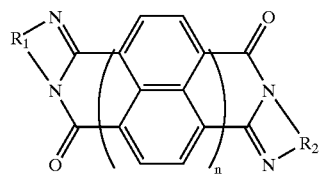

(Trans)

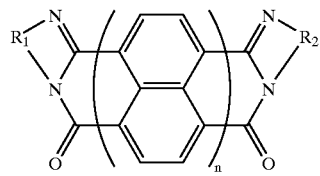

(Cis)

n is 1, 2 or 3 for the polycyclic moiety, particularly where n is 1 or 2, when n is 2 or 3, or when n is 2; and $R_1$ and $R_2$ are independently selected from the group consisting of a hydrocarbon ring and a heterocyclic group, wherein $R_1$ and $R_2$ are the same or different hydrocarbon ring, the same or different heterocyclic group, or one of $R_1$ and $R_2$ is the hydrocarbon ring and the other the heterocyclic group.

Both geometric isomers of the compound when employed in a semiconductor layer of an electronic device are considered n-type semiconductor materials. The semiconductor layer in embodiments is composed solely of either or both geometric isomers of the compound. In other embodiments, the semiconductor layer is composed of either or both geometric isomers of the Compound and further includes one or more other materials such as a different n-type semiconductor material where any suitable ratio by weight of the various components may be employed such as from about 10%(Compound)/90%(other material(s)) to about 90%(Compound)/10%(other material(s)).

The term "polycyclic moiety" encompasses both unsubstituted and substituted embodiments. In substituted embodiments of the polycyclic moiety, there is substitution by a substituent a number of times such as one, two, three or more times, where the substituent may be for example a halogen, a hydrocarbon group or a heteroatom containing group. Where two or more substituents are present on the polycyclic moiety, each substituent may be the same or different from each other. The one or more substituents on the polycyclic moiety may be placed at any suitable position or positions; in other words, any suitable substitution pattern may be employed. For example, a single substituent on the polycyclic moiety may be at position 1, 2, 3, or 4 where the position numbers are depicted as follows.

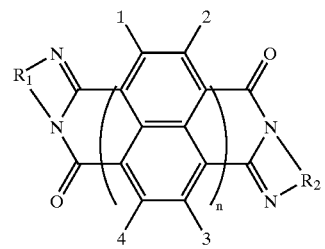

Two substituents on the polycyclic moiety may be for instance at positions 1 and 2, positions 1 and 3, positions 2 and 4, positions 2 and 3, or positions 1 and 4 where the position numbers are depicted above.

The halogen substituent on the polycyclic moiety may be bromine, fluorine, chlorine, and iodine.

As a substituent, the hydrocarbon group on the polycyclic moiety may be for example the following:

(a) an alkyl group which may be straight chain or branched, having for instance 1 to about 16 carbon atoms, such as methyl, ethyl, propyl, 2-methylpropyl, and the like; and (b) a phenyl group.

As a substituent, the heteroatom containing group on the polycyclic moiety may be for example the following:

(a) an alkyloxy group having for instance 2 to about 16 carbon and oxygen atoms, particularly 2 to about 10 carbon and oxygen atoms, such as methoxy, ethoxy, butoxy and the like;

(b) an amino group, —N($R_3$)($R_4$), where $R_3$ and $R_4$ may be the same or different from each other and may be for example hydrogen, an alkyl group or an aryl group having 1 to about 10 carbon atoms, such as —$NH_2$, —N($CH_3$)$_2$, —N($C_6H_5$)$_2$, and the like;

(c) a nitro group ($NO_2$); and (d) a cyano group (CN).

To illustrate the polycyclic moiety where n is 1, 2, and 3, the following exemplary geometric isomers of the compound are provided:

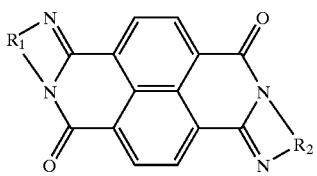

where n is 1;

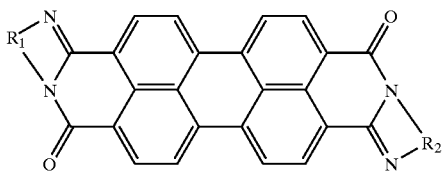

where n is 2; and

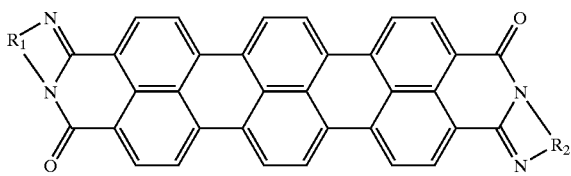

where n is 3.

When $R_1$ and/or $R_2$ is a hydrocarbon ring, the phrase hydrocarbon ring encompasses both unsubstituted and substituted embodiments. In unsubstituted embodiments, the hydrocarbon ring may include one, two, three or more rings and may contain for instance 3 to about 30 carbon atoms, where the hydrocarbon ring may be for example the following:

(a) a benzo ring;
(b) a naphthalenediyl ring; and
(c) an alicyclic hydrocarbon which may be saturated or unsaturated and includes for instance 3 to about 20 carbon atoms, where exemplary alicyclic hydrocarbons are for example cyclopropylene, 3-methylcyclobutylene, and 2,4-cyclopentadienylene.

When $R_1$ and/or $R_2$ is a heterocyclic group, the phrase heterocyclic group encompasses both unsubstituted and substituted embodiments. In unsubstituted embodiments, the heterocyclic group may include one, two, three or more rings, where one, two, three or more of the same or different heteroatom may be present in the ring or rings, and the heteroatom(s) can be for instance N, O, S, P, and Se. In unsubstituted embodiments, the heterocyclic group may contain for instance 3 to about 20 atoms (referring to number of carbon atoms and heteroatom(s)) and may be for example the following:

a pyrido;
a thieno;
a furo; and
a pyrro.

There is now a discussion when $R_1$ and/or $R_2$ are selected from among a substituted hydrocarbon ring and a substituted heterocyclic group. In substituted embodiments of the hydrocarbon ring and in substituted embodiments of the heterocyclic group, there is substitution by a ring substituent a number of times such as one, two, three or more times, where the ring substituent(s) can be for example an alkyl group, an alkyloxy group, a halogen, and a nitrogen containing group. Where two or more ring substituents are present, each ring substituent may be the same or different from each other. The one, two or more ring substituents may be placed at any suitable position or positions; in other words, any suitable substitution pattern may be employed.

The alkyl group (ring substituent) may be straight chain or branched, having for instance 1 to about 10 carbon atoms, such as methyl, ethyl, propyl, 2-methylpropyl, and the like.

The alkyloxy group (ring substituent) may have for instance 2 to about 16 carbon and oxygen atoms, particularly 2 to about 10 carbon and oxygen atoms, such as methoxy, ethoxy, butoxy, and the like.

The halogen (ring substituent) may be bromine, fluorine, chlorine, and iodine.

The nitrogen containing group (ring substituent) may be for instance the following:

(a) an amino group, —N($R_3$)($R_4$), where $R_3$ and $R_4$ may be the same or different from each other and may be for example hydrogen, an alkyl group or an aryl group having 1 to about 10 carbon atoms, such as —$NH_2$, —N($CH_3$)$_2$, —N($C_6H_5$)$_2$, and the like;
(b) a nitro group ($NO_2$); and
(c) a cyano group (CN).

In embodiments of the present invention, there is provided the following exemplary geometric isomers of the Compound:

where n is 1 as follows,

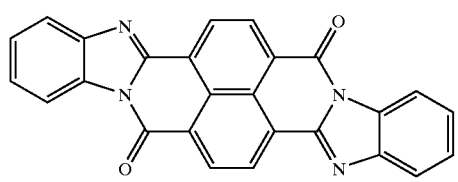

(1)

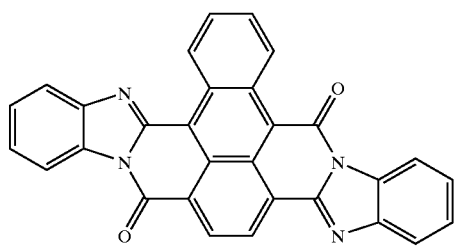

(2)

-continued
(3)
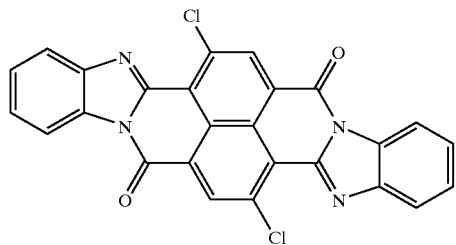
(4)
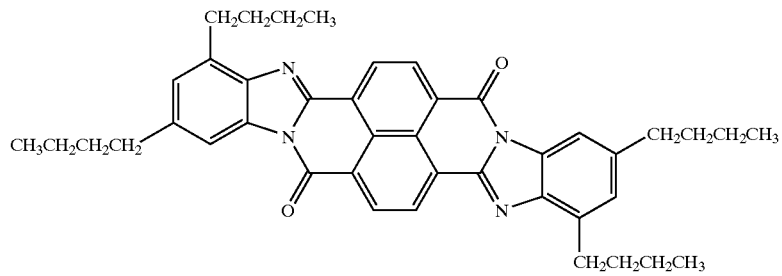
(5)
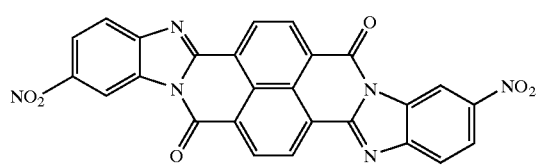
(6)
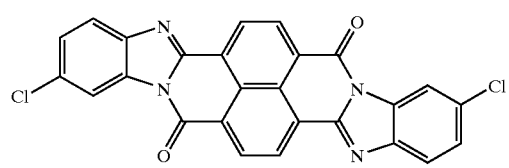
(7)
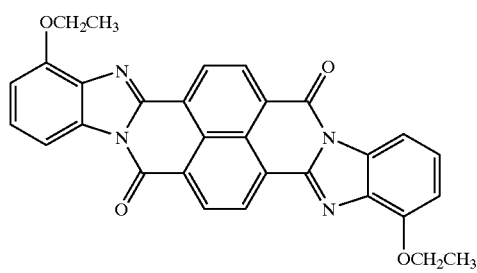
(8)
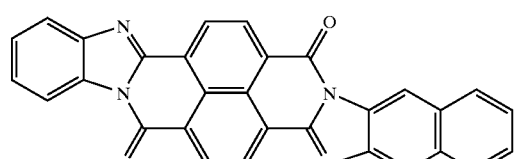
(9)
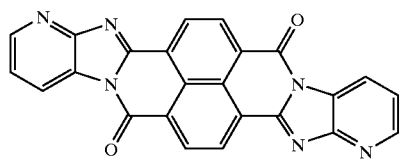
(10)
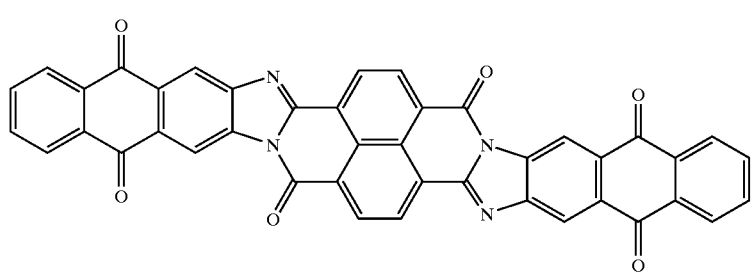
(11)

where n is 2 as follows,
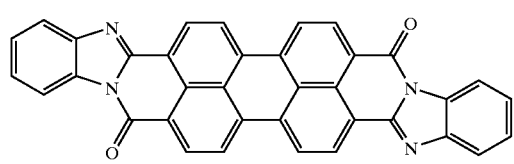 (12)
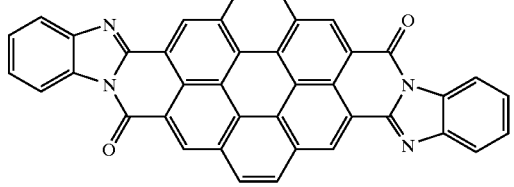 (13)
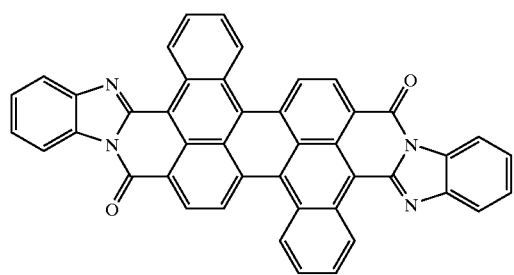 (14)
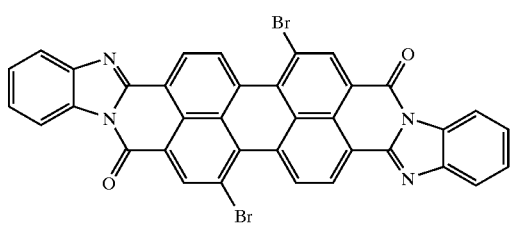 (15)
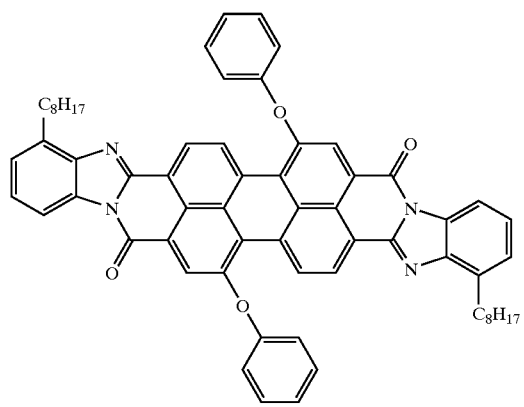 (16)
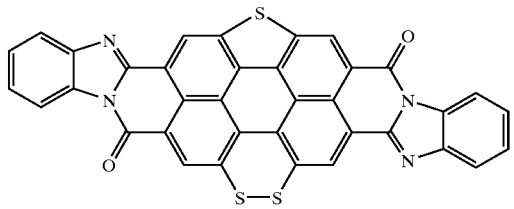 (17)
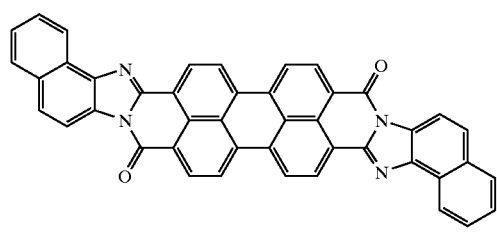 (18)
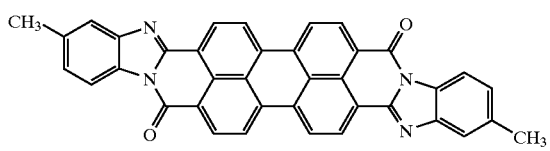 (19)
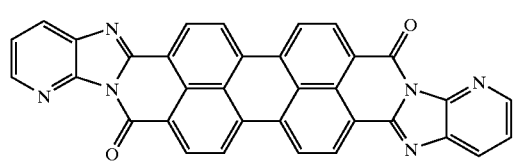 (20)
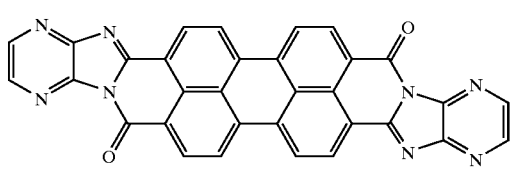 (21)
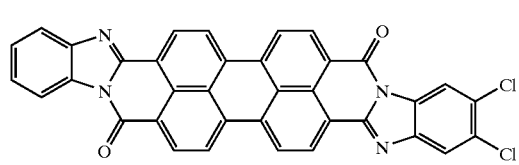 (22)
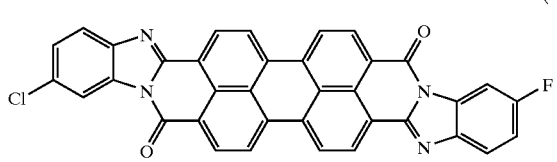 (23)

-continued

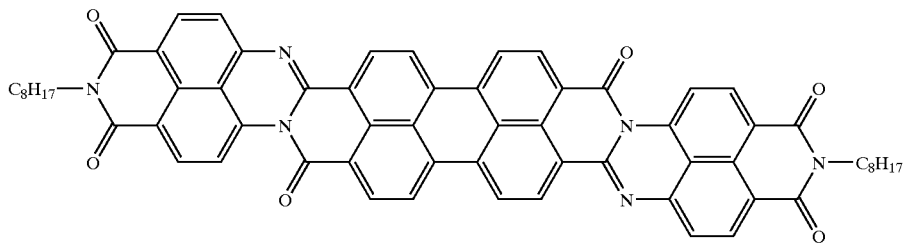

(24)

where n is 3 as follows,

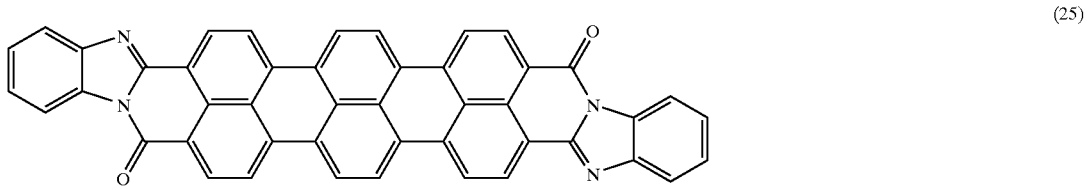

(25)

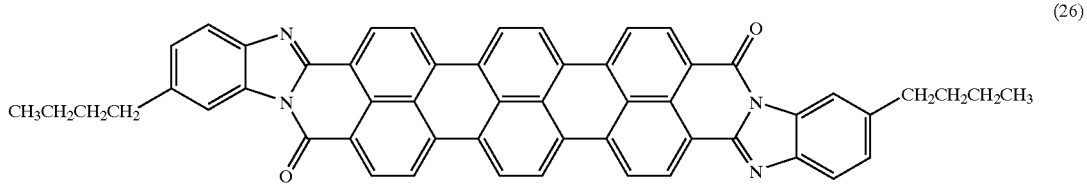

(26)

As an illustration, when the polycyclic moiety is unsubstituted, n is 2, and $R_1$ and $R_2$ are unsubstituted benzo groups, the Compound is benzimidazole perylenetetracarboxylic acid diimide (referred herein as "BZP") as depicted in Formula (12). Procedures for synthesizing BZP are known and BZP is commercially available. An exemplary procedure for preparing BZP is discussed in Example 1 herein.

As illustrated in Scheme 1 (where R is depicted since $R_1$ and $R_2$ are the same), the Compounds can be generally prepared by the condensation reaction of the appropriate tetracarboxylic acid or the corresponding anhydrides with appropriate amine(s) in a solvent such as quinoline, in the presence of a catalyst, and with heating at elevated temperatures such as 180 degrees C. to 230 degrees C. When $R_1$ and $R_2$ are different, two-step condensation of tetracarboxylic acid or the corresponding anhydrides with the appropriate amine may be used.

Scheme 1

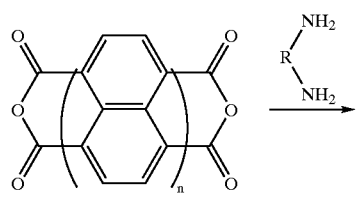

-continued

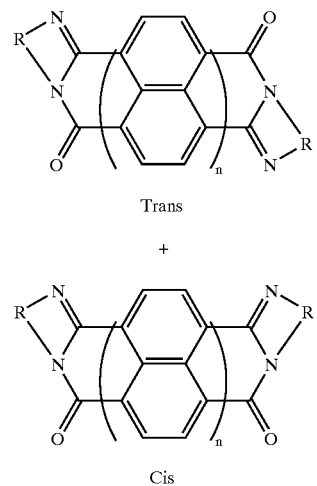

Either or both of the cis and trans forms of the Compound may be used. If a mixture of the two geometric isomers is used, any appropriate ratio by weight may be employed such as from about 5%(cis)/95%(trans) to about 95%(cis)/5%(trans). If it is desired to use only one geometric isomer, or a mixture with one geometric isomer as the main fraction, any suitable separation and purification techniques may be employed to isolate the desired geometric isomer from the other geometric isomer. Methods such as column chromatography and vacuum sublimation may be used.

Any suitable technique may be used to form the semiconductor layer containing the geometric isomer(s) of the Compound. In embodiments, deposition by a rapid sublimation method may be used. One such method is to apply a vacuum of about $10^{-5}$ to $10^{-7}$ torr to a chamber containing a substrate and a source vessel that holds the Compound in powdered form. Heat the vessel until the Compound sublimes onto the substrate. The charge carrier mobility of such films can be capable of manipulating by carefully controlling the heating rate, the maximum source temperature and/or substrate temperature during process. In addition, deposition into a film by solution deposition may be used. The phrase "solution deposition" refers to any liquid composition compatible deposition technique such as spin coating, blade coating, rod coating, screen printing, ink jet printing, stamping and the like.

In embodiments, the present invention may be used whenever there is a need for a semiconductor layer in an electronic device. The phrase "electronic device" refers to micro- and nano-electronic devices such as, for example, micro- and nano-sized transistors and diodes. Illustrative transistors include for instance thin film transistors, particularly organic field effect transistors.

In FIG. 1, there is schematically illustrated a thin film transistor ("TFT") configuration 10 comprised of a substrate 16, in contact therewith a metal contact 18 (gate electrode) and a layer of an insulating layer 14 on top of which two metal contacts, source electrode 20 and drain electrode 22, are deposited. Over and between the metal contacts 20 and 22 is an organic semiconductor layer 12 as illustrated herein.

Figure 2:
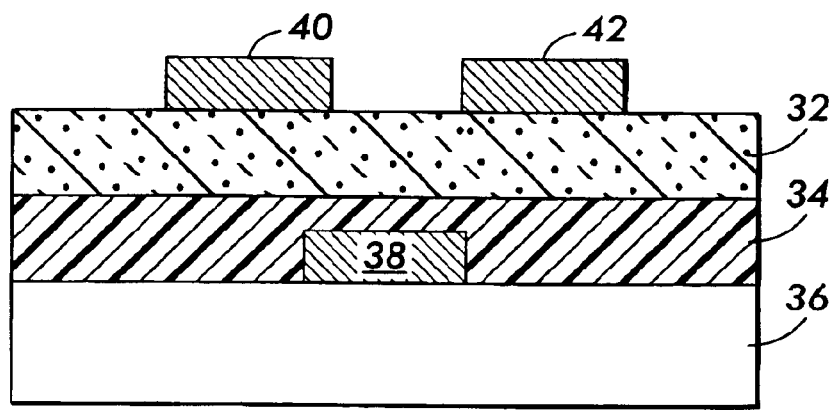
FIG. 2 represents a second embodiment of the present invention in the form of a thin film transistor.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
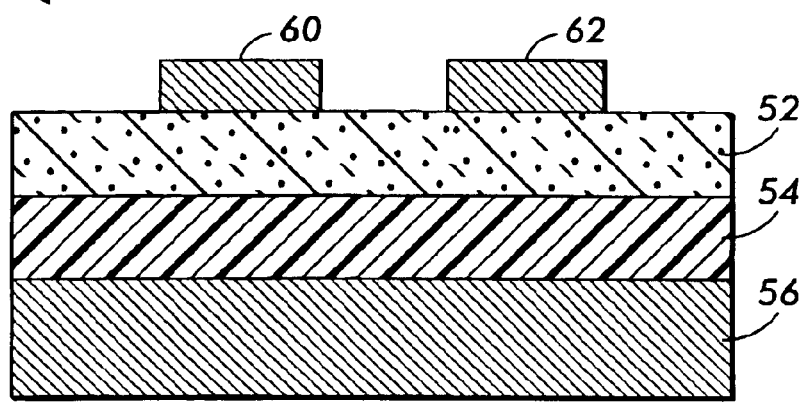
FIG. 3 represents a third embodiment of the present invention in the form of a thin film transistor.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
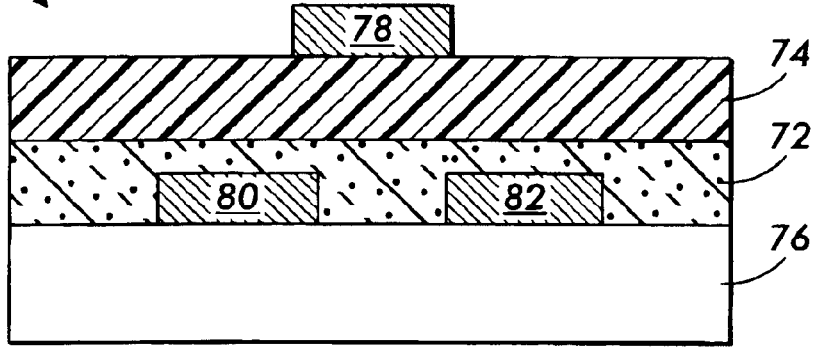
FIG. 4 represents a fourth embodiment of the present invention in the form of a thin film transistor.

FIG. 4 schematically illustrates an additional TFT configuration 70 comprised of substrate 76, a gate electrode 78, a source electrode 80, a drain electrode 82, an organic semiconductor layer 72, and an insulating layer 74.

The composition and formation of the semiconductor layer are described herein.

The substrate may be composed of for instance silicon, glass plate, plastic film or sheet. For structurally flexible devices, plastic substrate, such as for example polyester, polycarbonate, polyimide sheets and the like may be preferred. The thickness of the substrate may be from amount 10 micrometers to over 10 millimeters with an exemplary thickness being from about 50 to about 100 micrometers, especially for a flexible plastic substrate and from about 1 to about 10 millimeters for a rigid substrate such as glass or silicon.

The compositions of the gate electrode, the source electrode, and the drain electrode are now discussed. The gate electrode can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELEC-TRODAG™ available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors. The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 1 micrometer with the more specific thickness being about 100 to about 400 nanometers.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nanometers to about 500 nanometers depending on the dielectric constant of the dielectric material used. An exemplary thickness of the insulating layer is from about 100 nanometers to about 500 nanometers. The insulating layer may have a conductivity that is for example less than about $10^{-12}$ S/cm.

The insulating layer, the gate electrode, the semiconductor layer, the source electrode, and the drain electrode are formed in any sequence as long as the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The semiconductor layer has a thickness ranging for example from about 10 nanometers to about 1 micrometer, or from about 30 to about 150 nanometers. The TFT devices contain a semiconductor channel with a width W and length L. The semiconductor channel width may be, for example, from about 1 micrometers to about 5 millimeters, with a specific channel width being about 5 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +20 volts to about −80 volts is applied to the gate electrode.

Regarding electrical performance characteristics, a semiconductor layer of the present electronic device has a carrier mobility greater than for example about $10^{-3}$ cm$^2$/Vs (centimeters$^2$/Volt-second) and a conductivity less than for example about $10^{-5}$ S/cm (Siemens/centimeter). The thin film transistors produced by the present process have an on/off ratio greater than for example about $10^3$ at 20 degrees C. The phrase on/off ratio refers to the ratio of the source-drain current when the transistor is on to the source drain current when the transistor is off.

The invention will now be described in detail with respect to specific embodiments thereof, it being understood that these examples are intended to be illustrative only and the invention is not intended to be limited to the materials, conditions, or process parameters recited herein. All percentages and parts are by weight unless otherwise indicated. As used herein, room temperature refers to a temperature of about 25 degrees C.

EXAMPLE 1

Synthesis of BZP (Compound of Formula (12)

About 5.85 grams of 3,4,9,10-perylenetetracarboxylic dianhydride, 26.77 grams of o-phenylene diamine and 7 milliliters of glacial acetic acid were mixed in a round-bottom flask. The resulting mixture was then heated with stirring for 8 hours at 210 degrees C., following by cooling to room temperature. A solid product was then obtained by filtering the mixture through a sintered glass funnel. Then the solid was washed with 1 liter of methanol and slurried with 0.5 liter of 1 percent sodium hydroxide solution. After filtration again, the solid was washed with 600 milliliters of water, and then dried in an oven at 80 degrees C. overnight, yielding 7.5 grams of BZP. The crude product was further purified by sublimation twice for organic TFT use.

Device Fabrication

There was selected a top-contact thin film transistor configuration as schematically illustrated, for example, in FIG. 3. The test device was comprised of an n-doped silicon wafer with a thermally grown silicon oxide layer of a thickness of about 300 nanometers thereon. The wafer functioned as the gate electrode while the silicon oxide layer acted as the gate dielectric and had a capacitance of about 10 $nF/cm^2$ (nanofarads/square centimeter). The silicon wafer was first cleaned with isopropanol, oxygen plasma, isopropanol and air dried. Then the clean substrates were immersed in a 0.1 M solution of various silane agents such as 1,1,1,3,3,3-hexamethyldisilazane (HMDS), octyltrichlorosilane (OTS8), phenylene trichlorosilane (PTS) at 60 degrees C. for 10 min. Subsequently, the wafer was washed with dichloromethane and dried. The test semiconductor BZP layer of about 50 nanometers to 100 nanometers in thickness was then deposited on top of the silicon oxide dielectric layer under a high vacuum of $10^{-6}$ torr. The substrate temperatures were held at room temperature, 70 or 120 degrees C. Thereafter, the gold source and drain electrodes of about 50 nanometers were deposited on top of the semiconductor layer by vacuum deposition through a shadow mask with various channel lengths and widths, thus creating a series of transistors of various dimensions.

Device Evaluation

The evaluation of field-effect transistor performance was accomplished in a black box (that is, a closed box which excluded ambient light) at ambient conditions using a Keithley 4200 SCS semiconductor characterization system. The carrier mobility, $\mu$, was calculated from the data in the saturated regime (gate voltage, $V_G$<source-drain voltage, $V_{SD}$) according to equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$.

Another property of field-effect transistor is its current on/off ratio. This is the ratio of the saturation source-drain current at the accumulation regime to the source-drain current at the depletion regime. After first measurement, device was kept in ambient condition for aging experiments.

TABLE 1

Effect of surface treatment agent on device performance.

| Surface treatment agent | HMDS | OTS8 | PTS | No treatment |
|---|---|---|---|---|
| Mobility ($cm^2/V \cdot s$) | $6.84 \times 10^{-4}$ | $3.45 \times 10^{-4}$ | $3.33 \times 10^{-4}$ | $7.86 \times 10^{-3}$ |
| On/off ratio | 28000 | 650000 | 670 | 55000 |
| Turn on voltage (V) | 6 | 20 | 26 | 22 |

TABLE 2

Effect of substrate temperature on device performance.

| Substrate temperature (° C.) | 25 | 70 | 120 |
|---|---|---|---|
| Mobility ($cm^2/V \cdot s$) | $2.28 \times 10^{-4}$ | $6.84 \times 10^{-4}$ | $1.28 \times 10^{-3}$ |
| On/off ratio | 12000 | 28000 | 490000 |
| Turn on voltage (V) | 22 | 6 | 12 |

Transfer characteristics of the devices showed that BZP was a n-type semiconductor. Table 1 summarizes performance of the device with different surface treatment layers. For these experiments, the substrate temperature was held at 70 degrees C. The device with HMDS treated substrate showed low turn-on voltage, high mobility, and high on/off ratio. Although the device with the OTS8 treated substrate exhibited very high current on/off ratio, it had a large turn-on voltage and lower mobility. Table 2 summarizes the performance of the devices with HMDS treated substrate at different substrate temperatures. The device with the substrate at room temperature showed poor performance. While at an elevated temperature such as 70 degrees C. or 120 degrees C. substrate temperature, the device provided a low turn-on voltage, high mobility and good on/off ratio. Generally, when comparing the transfer characteristics of devices fabricated on various surfaces and at different substrate temperatures, one can clearly see that the device with the HMDS modified surface and a substrate temperature of 120 degrees C. provided the best performance.

More important, aging experiments showed that the stability of BZP was excellent in air as compared to most other organic TFTs, particularly those with n-type semiconductors which lose their TFT properties when exposed to air. A freshly prepared device with HMDS modified wafer as substrate and substrate temperature of 70 degrees C. showed a field effect mobility of $1.28 \times 10^{-3}$ $cm^2/V.s$ and current on/off ratio about $4.9 \times 10^5$. After being exposed to ambient oxygen in the dark for 1 month, a mobility of $5.5 \times 10^{-4}$ $cm^2/V.s$ and current on/off ratio about $1.4 \times 10^5$ were observed. Only a slight degradation of performance was detected.

EXAMPLE 2

Synthesis of Compound of Formula (19)

About 5.85 grams of 3,4,9,10-perylenetetracarboxylic dianhydride, 18.5 grams of 3,4-diaminotoluene and 7 milliliters of glacial acetic acid were mixed in a round-bottom flask. The resulting mixture was then heated with stirring for 8 hours at 210 degrees C., following by cooling to room temperature. A solid product was then obtained by filtering the mixture through a sintered glass funnel. Then the solid was washed with 1 liter of methanol and slurried with 0.5 liter of 1 percent sodium hydroxide solution. After filtration again, the solid was washed with 600 milliliters of water, and then dried in an oven at 80 degrees C. overnight, yielding 7.8 grams of Compound of Formula (19). The crude product was further purified by sublimation twice for organic TFT use.

EXAMPLE 3 (Hypothetical Example)

Synthesis of Compound of Formula (8)

About 0.015 mole of 1,4,5,8-naphthalenetetracarboxylic dianhydride, 0.02 mole of o-phenylene diamine and 7 milliliters of glacial acetic acid are mixed in a round-bottom flask. The resulting mixture is then heated with stirring for 8 hours at 210 degrees C., followed by cooling to room temperature. A solid product is then obtained by filtering the mixture through a sintered glass funnel. Then the solid is washed with 1 liter of methanol and slurried with 0.5 liter of 1 percent sodium hydroxide solution. After filtration again, the solid is washed with 600 milliliters of water, and then dried in an oven at 80 degrees C. overnight. The crude product is used for next step reaction.

About 0.01 mole of above product, 0.03 mole of 2,3-naphthalene diamine and 7 milliliters of glacial acetic acid are mixed in a round-bottom flask. The resulting mixture is then heated with stirring for 8 hours at 210 degrees C., following by cooling to room temperature. A solid product is then obtained by filtering the mixture through a sintered glass funnel. Then the solid is washed with 1 liter of methanol and slurried with 0.5 liter of 1 percent sodium hydroxide solution. After filtration again, the solid is washed with 600 milliliters of water, and then dried in an oven at 80 degrees C. overnight. The crude product is separated by column chromatography or vacuum sublimation and yields the Compound of Formula (8).

We claim:

1. An electronic device comprising a semiconductor layer in contact with a number of electrodes, wherein the semiconductive layer includes a compound wherein either or both of the following geometric isomers of the compound are present:

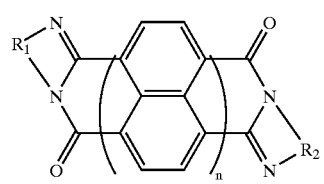
(Trans)

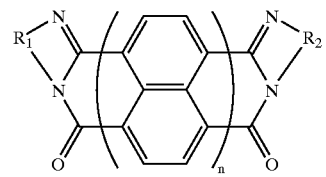
(Cis)

wherein:

n is 1, 2 or 3 for the polycyclic moiety; and $R_1$ and $R_2$ are independently selected from the group consisting of a hydrocarbon ring and a heterocyclic group, wherein $R_1$ and $R_2$ are the same or different hydrocarbon ring, the same or different heterocyclic group, or one of $R_1$ and $R_2$ is the hydrocarbon ring and the other the heterocyclic group.

2. The device of claim 1, wherein the polycyclic moiety is unsubstituted.

3. The device of claim 1, wherein the polycyclic moiety is substituted at least once by a substituent which is a halogen, a hydrocarbon group or a heteroatom containing group.

4. The device of claim 3, wherein for the substituent on the polycyclic moiety, the hydrocarbon group is an alkyl group or a phenyl group.

5. The device of claim 3, wherein for the substituent on the polycyclic moiety, the heteroatom containing group is an alkyloxy group, an amino group, a nitro group, or a cyano group.

6. The device of claim 1, wherein $R_1$ and $R_2$ are the same or different hydrocarbon ring.

7. The device of claim 1, wherein the hydrocarbon ring is a benzo group, a naphthalenediyl group, or an alicyclic hydrocarbon group.

8. The device of claim 1, wherein $R_1$ and $R_2$ are the same or different heterocyclic group.

9. The device of claim 1, wherein the heterocyclic group is pyrido, thieno, furo, or pyrro.

10. The device of claim 1, wherein the hydrocarbon ring and the heterocyclic group are unsubstituted.

11. The device of claim 1, the hydrocarbon ring and the heterocyclic group are substituted at least once with a substituent selected from the group consisting of an alkyl group, an alkyloxy group, a halogen, and a nitrogen containing group.

12. The device of claim 1, wherein the device is a thin film transistor.

13. The device of claim 1, wherein both the cis and trans geometric isomers of the compound are present.

14. The device of claim 1, wherein n is 2, $R_1$ and $R_2$ are both an unsubstituted benzo ring, and the polycyclic moiety is unsubstituted, yielding benzimidazole perylenetetracarboxylic acid diimide.

15. The device of claim 1, further comprising a plastic substrate.

16. The device of claim 1, the semiconductor layer has a thickness ranging from about 10 nanometers to about 1 micrometer.

17. A thin film transistor device comprising:
an insulating layer;
a gate electrode;
a semiconductor layer;
a source electrode; and
a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, wherein the semiconductor layer includes a compound wherein either or both of the following geometric isomers of the compound are present:

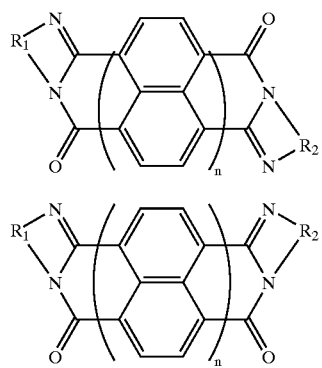

wherein:

n is 1, 2 or 3 for the polycyclic moiety; and $R_1$ and $R_2$ are independently selected from the group consisting of a hydrocarbon ring and a heterocyclic group, wherein $R_1$ and $R_2$ are the same or different hydrocarbon ring, the same or different heterocyclic group, or one of $R_1$ and $R_2$ is the hydrocarbon ring and the other the heterocyclic group.

18. The device of claim 17, wherein the polycyclic moiety is unsubstituted.

19. The device of claim 17, wherein the hydrocarbon ring and the heterocyclic group are un substituted.

20. The device of claim 17, wherein n is 2, $R_1$ and $R_2$ are both an unsubstituted benzo ring, and the polycyclic moiety is unsubstituted, yielding benzimidazole perylenetetracarboxylic acid diimide.

21. The device of claim 17, further comprising a plastic substrate.

22. The device of claim 17, the semiconductor layer has a thickness ranging from about 10 nanometers to about 1 micrometer.

* * * * *

UNITED STATES PATENT AND TRADEMARK OFFICE
CERTIFICATE OF CORRECTION

PATENT NO. : 6,861,664 B2  Page 1 of 1
APPLICATION NO. : 10/627860
DATED : March 1, 2005
INVENTOR(S) : Ong et al.

It is certified that error appears in the above-identified patent and that said Letters Patent is hereby corrected as shown below:

In column 1, the following section should be added before the section title BACKGROUND OF THE INVENTION:

--STATEMENT REGARDING FEDERALLY SPONSORED RESEARCH OR DEVELOPMENT
 This invention was made with United States Government support under Cooperative Agreement No. 70NANBOH3033 awarded by the National Institute of Standards and Technology (NIST). The United States Government has certain rights in the invention.--

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,861,664 B2 |
| APPLICATION NO. | : 10/627860 |
| DATED | : March 1, 2005 |
| INVENTOR(S) | : Ong et al. |

It is certified that error appears in the above-identified patent and that said Letters Patent is hereby corrected as shown below:

In the Specification

In column 1, the following section should be added before the section title BACKGROUND OF THE INVENTION:

--STATEMENT REGARDING FEDERALLY SPONSORED RESEARCH OR DEVELOPMENT
  This invention was made with United States Government support under Cooperative Agreement No. 70NANB0H3033 awarded by the National Institute of Standards and Technology (NIST). The United States Government has certain rights in the invention.--

This certificate supersedes the Certificate of Correction issued March 6, 2007.

Signed and Sealed this
Seventeenth Day of September, 2013

Teresa Stanek Rea
*Deputy Director of the United States Patent and Trademark Office*